(12) United States Patent
Brandl

(10) Patent No.: US 12,195,325 B2
(45) Date of Patent: Jan. 14, 2025

(54) MEMS DEVICES WITH SUPPORT STRUCTURES AND ASSOCIATED PRODUCTION METHODS

(71) Applicant: Infineon Technologies AG, Neubiberg (DE)

(72) Inventor: Florian Brandl, Maxhütte-Haidhof (DE)

(73) Assignee: Infineon Technologies AG, Neubiberg (DE)

( * ) Notice: Subject to any disclaimer, the term of this patent is extended or adjusted under 35 U.S.C. 154(b) by 593 days.

(21) Appl. No.: 17/321,897

(22) Filed: May 17, 2021

(65) Prior Publication Data

US 2021/0363001 A1 Nov. 25, 2021

(30) Foreign Application Priority Data

May 20, 2020 (DE) .......................... 102020113760.5

(51) Int. Cl.
*B81B 3/00* (2006.01)
*B81C 1/00* (2006.01)

(52) U.S. Cl.
CPC ........ *B81B 3/0072* (2013.01); *B81C 1/00666* (2013.01); *B81B 2201/0257* (2013.01); *B81B 2201/0264* (2013.01); *B81B 2203/0315* (2013.01); *B81B 2207/11* (2013.01)

(58) Field of Classification Search
CPC . B81B 3/0072; B81B 3/0078; B81B 2207/11; B81B 2201/0257; B81B 2201/025; B81B 2203/0127; B81B 2201/0264; B81B 2203/0315; B81C 1/00666
See application file for complete search history.

(56) References Cited

U.S. PATENT DOCUMENTS

| | | |
|---|---|---|
| 2003/0016839 A1 | 1/2003 | Loeppert et al. |
| 2005/0132814 A1 | 6/2005 | Satou et al. |
| 2006/0280319 A1 | 12/2006 | Wang et al. |
| 2014/0054728 A1* | 2/2014 | Maling ............... B81C 1/00825 716/100 |
| 2018/0002168 A1 | 1/2018 | Cargill et al. |
| 2018/0086624 A1 | 3/2018 | Cheng et al. |
| 2018/0148315 A1* | 5/2018 | Hanley .................. H04R 19/04 |
| 2020/0071157 A1 | 3/2020 | Yang et al. |
| 2020/0109048 A1 | 4/2020 | Lee et al. |

FOREIGN PATENT DOCUMENTS

DE 69936794 T2 4/2008

* cited by examiner

*Primary Examiner* — Hrayr A Sayadian
(74) *Attorney, Agent, or Firm* — Harrity & Harrity, LLP

(57) ABSTRACT

A microelectromechanical system (MEMS) device contains a movable MEMS structure, a first support structure in which an edge of the MEMS structure is attached, a cavity which is bounded by the MEMS structure and the first support structure, and a second support structure which is attached in the cavity and at the edge of the MEMS structure and is configured so as to support the edge of the MEMS structure mechanically.

20 Claims, 5 Drawing Sheets

MEMS DEVICES WITH SUPPORT STRUCTURES AND ASSOCIATED PRODUCTION METHODS

RELATED APPLICATION

This application claims priority to German Patent Application No. 102020113760.5, filed on May 20, 2020, which is incorporated herein by reference in its entirety.

FIELD

The present disclosure relates to microelectromechanical system (MEMS) devices with support structures and to methods for producing such MEMS structures.

BACKGROUND

MEMS (microelectromechanical system) devices can be used to sense, for example pressures, accelerations, light, gas, etc. For this, the MEMS devices can have movable MEMS structures which can be deflected in reaction to physical variables which are to be sensed. A deflection of a MEMS structure can be converted into a measurement signal from which the physical variable can be inferred. External influences such as, for example mechanical stresses of the MEMS device can result in parasitic and undesired signals which can bring about falsification of measurement results. Producers of MEMS devices are continuously striving to improve their products. In particular, it may be desirable here to provide cost-effective MEMS devices with improved measurement results. In addition, it may be desirable to provide associated methods for producing such MEMS devices.

SUMMARY

Various aspects relate to a MEMS device. The MEMS device comprises a movable MEMS structure and a first support structure in which one edge of the MEMS structure is attached. The MEMS device also comprises a cavity which is bounded by the MEMS structure and the first support structure, and a second support structure which is attached in the cavity and at the edge of the MEMS structure and is configured so as to support the edge of the MEMS structure mechanically.

Various aspects relate to a method for producing a MEMS device. The method comprises depositing a sacrificial layer and forming at least one opening in the sacrificial layer. The method also comprises depositing a first material in the at least one opening in the sacrificial layer and depositing a second material over the sacrificial layer, wherein a first support structure and a MEMS structure are formed, an edge of the MEMS structure is attached in the first support structure, and the material which is deposited in the least one opening forms a second support structure which is attached at the edge of the MEMS structure and is configured so as to support the edge of the MEMS structure mechanically. The method also comprises removing the sacrificial layer, wherein a cavity which is bounded by the MEMS structure and the first support structure is formed.

BRIEF DESCRIPTION OF THE DRAWINGS

Devices and methods according to the disclosure are explained in more detail below with reference to drawings. The elements shown in the drawings are not necessarily represented true to scale in relation to one another. Identical reference symbols can denote identical components.

DETAILED DESCRIPTION

The figures described below show microelectromechanical system (MEMS) devices and methods for producing MEMS devices according to the disclosure. In this context, the described devices and methods can be illustrated in a general way, in order to describe aspects of the disclosure in a qualitative fashion. The described devices and methods can have further aspects which cannot be shown in the respective figure for the sake of simplicity. The respective example can, however, be expanded with aspects which are described in conjunction with other examples according to the disclosure. Consequently, statements relating to a specific figure can apply equally to examples of other figures.

Figure 1:
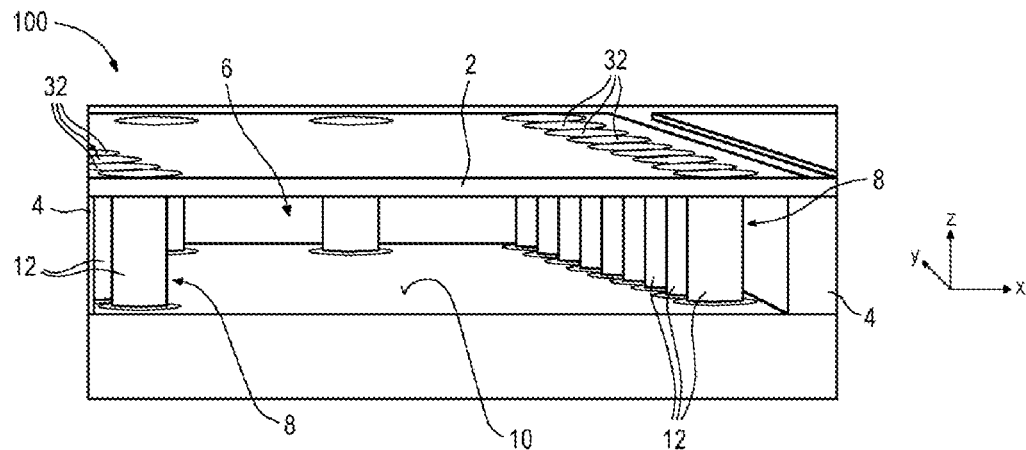
FIG. 1 shows a perspective cross-sectional side view of a MEMS device 100 according to the disclosure.

For the sake of simplicity, FIG. 1 shows only a detail of a MEMS device 100. The illustrated detail can also be referred to below as a (pressure-sensitive) MEMS cell. The MEMS device 100 can have a movable MEMS structure 2 and a first support structure 4. The MEMS structure 2 can be attached by its edge in the first support structure 4. In other words, the first support structure 4 can provide a suspension means for the movable MEMS structure 2 and can be configured so as to support the latter mechanically. A cavity 6 in the MEMS device 100 can be bounded by the MEMS structure 2 and the first support structure 4. The MEMS device 100 can also have a second support structure 8 which is attached in the cavity 6 and at the edge of the MEMS structure 2 and can be configured so as to support the edge of the MEMS structure 2 mechanically.

The MEMS device 100 can have, for example, a MEMS semiconductor chip or corresponds to such. A MEMS semiconductor chip can generally be a semiconductor chip with one or more MEMS structures which can be integrated into the MEMS sensor chip. In the example in FIG. 1, a movable MEMS structure 2 in the form of a membrane (or a diaphragm) is illustrated in an exemplary manner. Generally, MEMS structures can have one or more of the following: bridges, membranes, extension arms, spring bars, tongue structures, comb structures, etc. The MEMS device 100 can generally be configured to sense one or more physical variables, for example pressure, acceleration, temperature, air humidity, sound, etc., based on a deflection of the movable MEMS structure 2. Examples of MEMS devices are generally pressure sensors, tire pressure sensors, acceleration sensors, gas sensors, air humidity sensors, etc. In the example in FIG. 1, the MEMS device 100 can provide, in particular, the function of a pressure sensor or of a microphone. In a specific case, the MEMS device 100 can be embodied as a capacitive pressure sensor in which the MEMS structure 2 can be embodied as a movable electrode, and a bottom face 10 of the cavity 6 can be embodied as a fixed electrode. A capacitive pressure sensor can be embodied, for example, in the form of a Wheatstone bridge sensor.

In response to the physical variables to be sensed (e.g. air pressure), the movable MEMS structure 2 can be deflected in an essentially perpendicular direction with respect to the surface thereof. Deflections or movements of the MEMS structure 2 can be converted into electrical signals. For example, in the case of a capacitive pressure sensor, the movable MEMS structure 2 can be deflected as a movable capacitor plate relative to the fixed capacitor plate. As a result of the deflection, the distance between the capacitor plate and therefore the capacitance of the capacitor can change. A logic chip (not shown) or one or more circuits contained therein can be configured to process logically measurement signals which are provided by the MEMS structure 2. The logic chip can be, for example, an ASIC (Application Specific Integrated Circuit). In one example, the logic chip can be part of the MEMS device 100. In a further example, the logic chip can be arranged as a separate electronic component next to the MEMS device 100 on the same circuit board and can be connected electrically to the MEMS device 100.

The second support structure 8 can be configured to additionally mechanically support or mechanically stabilize the edge of the movable MEMS structure 2. The greater the distance between the second support structure 8 and the edge of the movable MEMS structure 2, the smaller the surface area of the deflectable part of the movable MEMS structure 2 can be, and the more sensitive the MEMS structure 2 can be with respect to pressure signals to be sensed. If said selected distance is too large, the MEMS structure 2 can be virtually or essentially insensitive to pressure, and it can be impossible to sense pressure signals. The distance between the second support structure 8 and the edge of the MEMS structure 2 can therefore be configured or selected, in particular, in such a way that the MEMS structure 2 is still configured so as to sense pressure signals, i.e. to remain pressure sensitive.

In the example in FIG. 1, the second support structure 8 can extend continuously from the ground face 10 of the cavity 6 as far as the underside of the movable MEMS structure 2. Such an embodiment of the MEMS structure 2 can be present, for example, in a capacitive pressure sensor. In a further example of a microphone, the MEMS device 100 can have three electrodes and two cavities which are arranged one on top of the other. In this context, a second support structure can be respectively provided for one or for both of the cavities. The respective second support structure can extend here from the bottom face of the respective cavity as far as the cover of the respective cavity.

In the example in FIG. 1, the second support structure 8 can comprise a multiplicity of columns 12 and be formed by such a column. The columns 12 can be arranged here in a row along the edge of the movable MEMS structure 2. In the example in FIG. 1, the columns 12 can be embodied in a cylindrical shape. In further examples, the columns 12 can have a different geometric shape, for example a cuboid, in the form of a right parallelepiped, etc. A vertical dimension of the second support structure 8 or a height of the cavity 6 in the z direction can lie, for example, in a range from approximately 50 nanometers to approximately 2 micrometers, to be more precise from approximately 100 nanometers up to approximately 1 micrometer. The second support structure 8 can be fabricated, for example, from at least one of the following materials: polycrystalline silicon, monocrystalline silicon, an oxide, a metal, a metal alloy.

The MEMS structure 2 can have a multiplicity of depressions 32 on a surface of the MEMS structure 2 facing away from the cavity 6. The depressions 32 can be arranged, in particular, at locations on the second support structure 8 which underlies the latter. The depressions 32 can arise, in particular, during production of the MEMS structure 2, as has been shown and described in conjunction with the method in FIG. 7.

Figure 9:
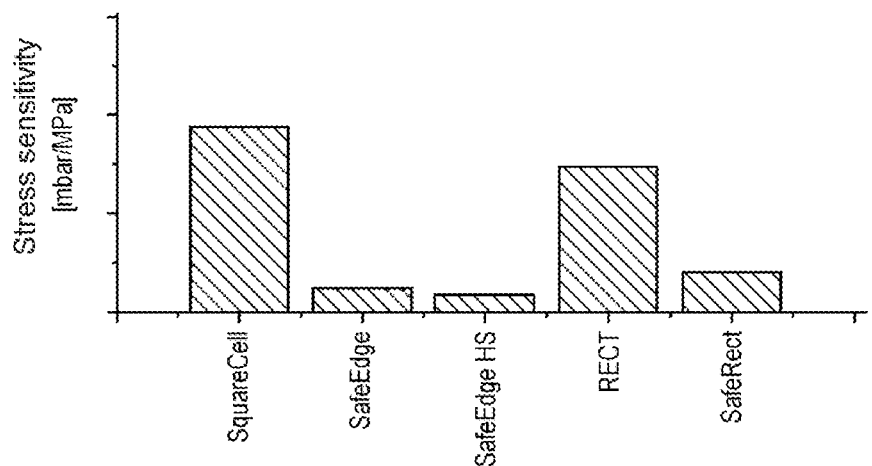
FIG. 9 shows a bar diagram illustrating stress sensitivities of MEMS devices with different movable MEMS structures.

A use of the second support structure 8 according to the disclosure can provide the technical effects described below. A lateral stress (or a mechanical stress) applied to the MEMS device 100 or the movable MEMS structure 2, in the x and/or y direction, can bring about shifting of pressure values measured by the MEMS device 100. In FIG. 9 described further below it is apparent that the use of the second support structure 8 can provide reduced stress sensitivity of a capacitive pressure sensor in the case of lateral stress. Furthermore, during production of the MEMS devices defects can occur in the movable MEMS structure 2 or when the movable MEMS structure 2 is suspended. From FIG. 10 which is described below it is apparent that the use of the second support structure 8 can provide a small effect of such a defect on the capacitance of a capacitive pressure sensor, and the MEMS cells can have increased robustness.

Figure 2:
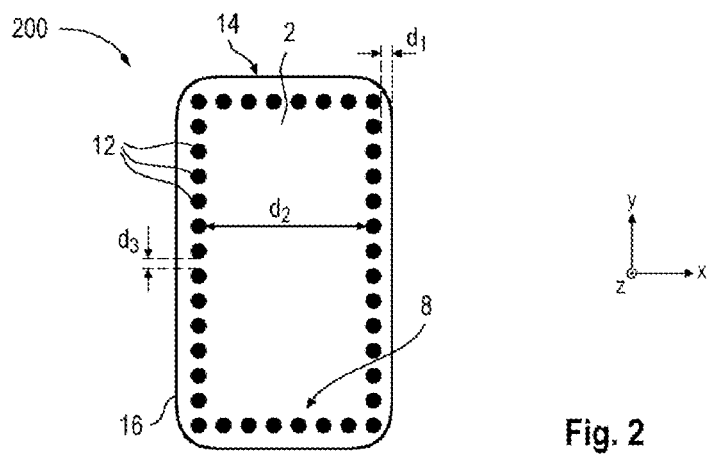
FIG. 2 shows a plan view of a MEMS device 200 according to the disclosure.

The MEMS device 200 which is shown in a plan view in FIG. 2 can have a (pressure-sensitive) MEMS cell 14 which can be similar to the MEMS cell shown in FIG. 1. The MEMS device 200 can have further components which, for the sake of simplicity are not illustrated in FIG. 2. For example, the MEMS device 200 can have a further (pressure-sensitive) MEMS cell (not shown). The two (pressure-sensitive) MEMS cells can be, for example, part of a Wheatstone bridge sensor. Such a Wheatstone bridge sensor can additionally have two reference cells (which are insensitive to pressure) (likewise not shown in FIG. 2).

In the example in FIG. 2, the face of the movable MEMS structure 2 in a non-deflected state can be arranged essentially in the x-y plane. The movable MEMS structure 2 can have an overall surface area which can be arranged within the attached edge 16 of the MEMS structure 2. In other words, the overall surface area of the MEMS structure 2 can be bounded by the first support structure 4. The second support structure 8 can enclose or bound an inner partial area of the MEMS structure 2 with a second surface area. A ratio of the surface area of this partial area to the overall surface area can be greater than approximately 0.5, to be more precise greater than approximately 0.4, to be more precise greater than approximately 0.3, to be more precise greater than approximately 0.2 and to be even more precise greater than approximately 0.1. The selection of such an area ratio can ensure, in particular, that the partial area which is bounded by the second support structure 8 remains pressure-sensitive. The area which is formed essentially in the form of a frame between the edge 16 and the second support structure 8 can, in contrast to this, be virtually or essentially insensitive to pressure.

In the example in FIG. 2, the MEMS structure 2 can have an essentially rectangular shape with two short sides and two long sides. The corners of the MEMS structure 2 can be round here. In further examples, the shape of the MEMS structure 2 can be selected differently, for example square, oval, elliptical, circular, etc. In FIG. 2, the second support structure 8 can run along the entire edge 16 of the MEMS structure 2. As an alternative to this, in further examples one or more sections of the edge 16 can be free of the second support structure 8 lying opposite. The second support structure 8 can be spaced apart from the edge 16 or from the first support structure 4 and run essentially parallel to the edge 16 of the MEMS structure 2.

In FIG. 2 a (in particular maximum) distance between the second support structure 8 and a column 12 and the edge 16 of the MEMS structure 2 is denoted by $d_1$. This distance $d_1$ can, of course, depend on the dimensions of the MEMS structure 2 and can in particular be selected such that the area of the MEMS structure 2 which is enclosed by the second support structure 8 remains pressure-sensitive. In a non-restricted example, the distance $d_1$ can be smaller than approximately 1 micrometer, to be more precise smaller than approximately 900 nanometers, to be more precise smaller than approximately 800 nanometers, to be more precise smaller than approximately 700 nanometers, to be more precise smaller than approximately 600 nanometers, and to be more precise smaller than approximately 500 nanometers.

In addition, in FIG. 2 a distance between opposite sections of the second support structure 8 or between opposite columns 12 is denoted by $d_2$. A ratio $d_1/d_2$ can be smaller than approximately 0.2, to be more precise smaller than approximately 0.1, and to be even more precise smaller than approximately 0.05. An (in particular maximum) distance $d_3$ between (directly) adjacent columns 12 of the second support structure 8 can also, of course, depend on the dimensions of the MEMS structure 2. In a non-restrictive example, the distance $d_3$ can be smaller than approximately 40 micrometers, to be more precise smaller than approximately 30 micrometers, to be more precise smaller than approximately 20 micrometers, to be more precise smaller than approximately 10 micrometers, and to be even more precise smaller than approximately 5 micrometers.

Figure 3:
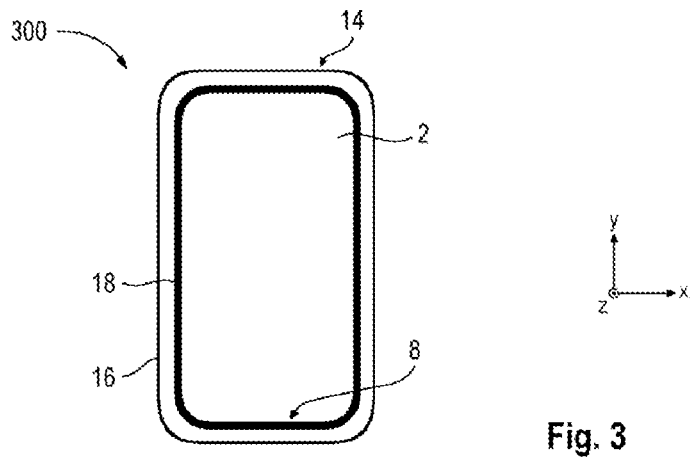
FIG. 3 shows a plan view of a MEMS device 300 according to the disclosure.

The MEMS device 300 shown in the plan view in FIG. 3 can be at least partially similar to the MEMS devices in FIGS. 1 and 2 which are described above. In contrast to FIG. 2, the second support structure 8 in FIG. 3 can have a wall structure 18 which can form a closed curve when viewed in the z direction. The curve can extend close to the edge 16 and essentially parallel thereto. In one example, the row of columns 12 in the MEMS device 100 in FIG. 1 can be replaced by a closed wall which extends along the edge of the MEMS structure 2 and can enclose a pressure-sensitive inner region of the MEMS structure 2. A dimension of the wall in the z direction can correspond to a height of the cavity 6.

Figure 4:
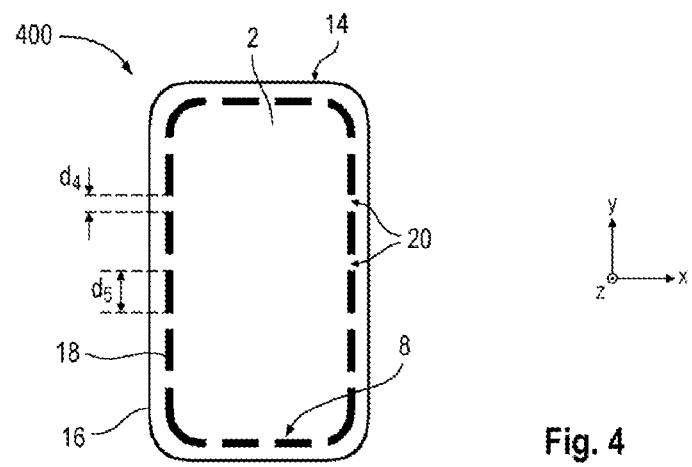
FIG. 4 shows a plan view of a MEMS device 400 according to the disclosure.

The MEMS device 400 shown in a plan view in FIG. 4 can be at least partially similar to the MEMS device 300 in FIG. 3. In contrast to FIG. 3, the wall structure 18 in the example in FIG. 4 can have a multiplicity of interruptions (i.e., gaps) 20. In other words, the second support structure 8 in FIG. 4 can be formed by a multiplicity of wall segments arranged one next to the other. In the example in FIG. 4, the interruptions 20 can be distributed evenly over the length of the wall structure 18. In further examples, a distribution of the interruptions 20 along the wall structure 18 can be uneven. A dimension $d_4$ of the interruptions 20 can be smaller than a dimension $d_5$ of the wall segments arranged between two adjacent interruptions 20, or vice versa. The dimensions of the interruptions 20 can essentially be the same or differ from one another.

Figure 5:
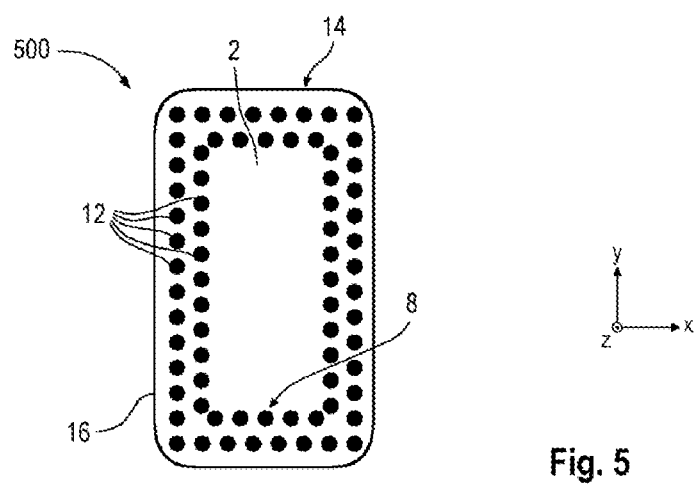
FIG. 5 shows a plan view of a MEMS device 500 according to the disclosure.

The MEMS device 500 shown in a plan view in FIG. 5 can be at least partially similar to the MEMS device 200 in FIG. 2. In contrast to FIG. 2, the second support structure 8 of the MEMS device 500 can additionally comprise a second multiplicity of columns 12 which can be arranged in a second row along the first row of columns 12. The second row of columns 12 can provide additional mechanical stabilization of the edge 16 of the MEMS structure 2.

Figure 6:
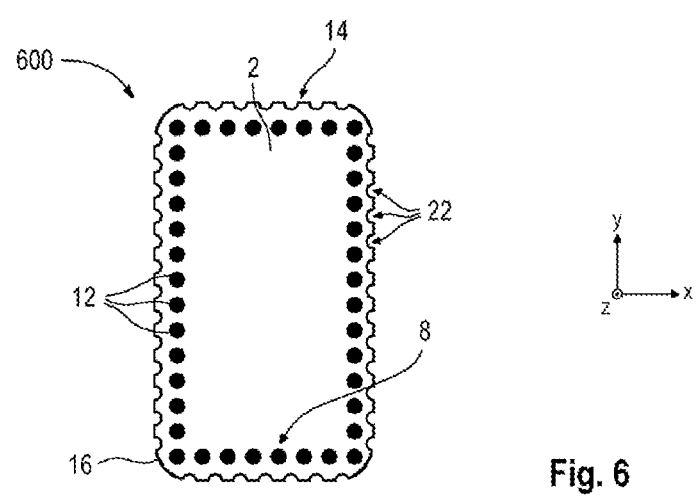
FIG. 6 shows a plan view of a MEMS device 600 according to the disclosure.

The MEMS device 600 shown in a plan view in FIG. 6 can be at least partially similar to the MEMS device 200 in FIG. 2. In contrast to FIG. 2, the edge 16 in FIG. 6 can have a multiplicity of notches 22. In the example in FIG. 6, the notches 22 can each be in the form of a circular section. The edge 16 can form here a "toothed edge" which can be similar to the edge of a stamp. In further examples, the notches 22 can have a different shape, for example square, rectangular, oval, elliptical, etc. The notches 22 can be distributed evenly along the edge 16 of the MEMS structure 2, as shown in FIG. 6, or not. The use of notches 22 can provide increased robustness of the edge 16.

FIGS. 7A to 7E show a cross-sectional side view of a method for producing a MEMS device 700 according to the disclosure which is shown in FIG. 0.7E.

Figure 7A:
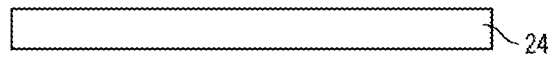
FIGS. 7A to 7E show a cross-sectional side view of a method for producing a MEMS device 700 according to the disclosure.

In FIG. 7A, it is possible to generate a material layer 24 which can form, for example, a bottom electrode of a capacitive pressure sensor in a MEMS device which is to be produced by the method. The material layer 24 can be fabricated, for example, from polysilicon.

Figure 7B:
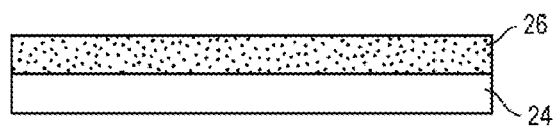

In FIG. 7B, a sacrificial layer 26 can be deposited over the material layer 24. The material of the sacrificial layer 26 can be configured to be removed again in a separate process step (cf. FIG. 7E). The sacrificial layer 26 can be fabricated, for example, from a photostructurable material such as, for example, oxide and/or carbon.

Figure 7C:
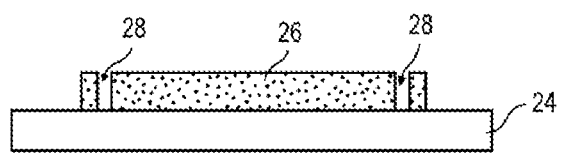

In FIG. 7C, the sacrificial layer 26 can be structured, for example, based on a photolithographic process. In this context, in particular one or more openings 28 can be formed in the sacrificial layer 26, which openings 28 can extend completely through the sacrificial layer 26 as far as the material layer 24. A material which is deposited in the openings 28 at a later time of the method can form a second support structure of the MEMS device which is to be produced. In one example, a multiplicity of openings 28 can be formed in the sacrificial layer 26, wherein a material which is deposited in the multiplicity of openings 28 can have a multiplicity of columns (cf. FIG. 2) after the later removal of the sacrificial layer 26. In a further example, a trench can be formed in the sacrificial layer 26, wherein a material which is deposited in the trench can have a wall structure (cf. FIG. 3) after the removal of the sacrificial layer 26. In yet a further example, a plurality of trench segments can be formed in the sacrificial layer 26, wherein a material which is deposited in the trench segments can have a wall structure with a plurality of wall segments (cf. FIG. 4) after the removal of the sacrificial layer 26.

Figure 7D:
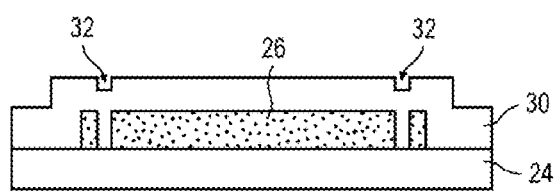

In FIG. 7D, a material layer 30 can be deposited over the material layer 24 and the sacrificial layer 26. In this context, the openings 28 can be filled by the material of the material layer 30. In this context, on the upper side of the material layer 30 depressions 32 can arise at locations of the openings 28 which previously lay underneath. In one example, the material layer 30 may be fabricated from polysilicon.

Figure 7E:
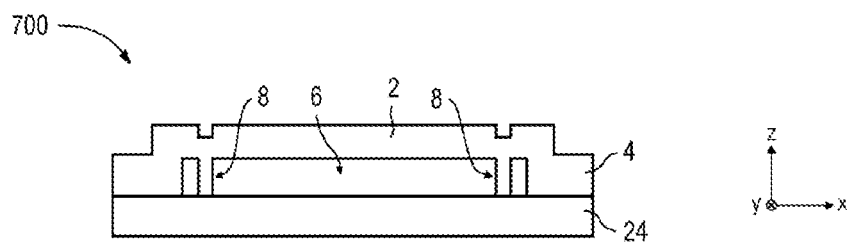

In FIG. 7E, the material of the sacrificial layer 26 can be removed, for example by at least one of a wet-chemical process, a wet-chemical washing process, an incineration process, etc. When the sacrificial material 26 is removed, a cavity 6 can be formed. The fabricated MEMS device 700 can have the components described in the preceding examples.

Figure 8A:
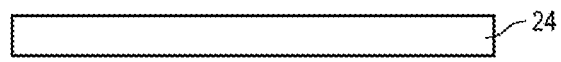
FIGS. 8A to 8F show a cross-sectional side view of a method for producing a MEMS device 800 according to the disclosure.
Figure 8B:
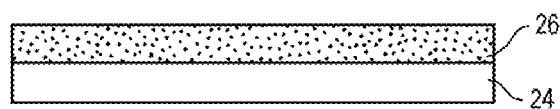
Figure 8C:
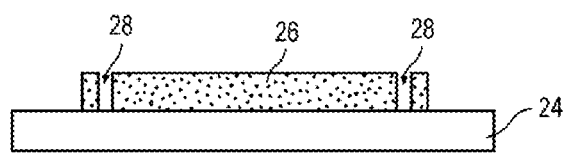
Figure 8D:
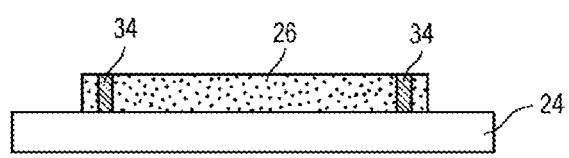
Figure 8E:
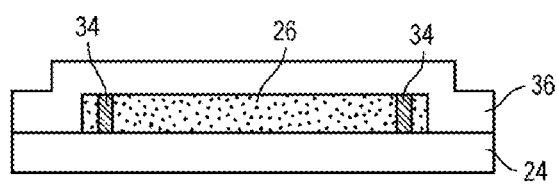
Figure 8F:
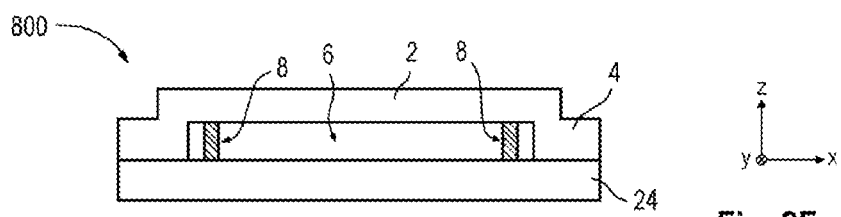

FIGS. 8A to 8F show a cross-sectional side view of a method for producing a MEMS device 800 according to the disclosure which is shown in FIG. 8F.

The process steps shown in FIGS. 8A to 8C can be similar to the process steps in FIGS. 7A to 7C.

In FIG. 8D, the openings 28 can be filled by a material 34. The material 34 can later form a second support structure of the MEMS device which is to be produced. For example, the material 34 can comprise an oxide or one of the possible materials mentioned further above for the second support structure.

In FIG. 8E, a material layer 36 can be deposited over the material layer 24 and the sacrificial layer 26. The material layer 36 can be similar to the material layer 30 in FIG. 7D and can be fabricated, for example, from polysilicon. Since the openings 28 have already been previously filled by the material 34, depressions do not necessarily have to arise on the upper side of the material layer 36, as described in conjunction with FIG. 7D.

In FIG. 8F, the material of the sacrificial layer 26 can be removed, as has already been described in relation to FIG. 7E. The fabricated MEMS device 800 can have the components described in preceding examples.

FIG. 9 shows a bar chart illustrating stress sensitivities of MEMS devices with different movable MEMS structures. The stress sensitivity for the respective MEMS structure is shown in the form of a bar. The stress sensitivity is plotted in the unit mbar/MPa on the vertical axis. The stress sensitivity indicates what shifting of a pressure measurement (in mbar) occurs for the respective MEMS structure when a lateral external stress (or a lateral mechanical stress) acts (in MPa) on the MEMS structure. The data which is illustrated in FIG. 9 is measurement data.

For the case of a conventional square MEMS structure (cf. "SquareCell") a comparatively high stress sensitivity can arise, which sensitivity can shift or falsify a pressure measurement of this MEMS structure to a comparatively large extent. Comparatively high stress sensitivity can also arise in a conventional rectangular MEMS structure (cf. "RECT"). The further bars of the diagram show stress sensitivities for a square MEMS structure with an additional second support structure (cf. "SafeEdge"), a square MEMS structure with an additional second support structure with increased sensitivity (cf. "SafeEdgeHS") and a rectangular MEMS structure with an additional second support structure (cf. "SafeRect"). Each of these stress sensitivities lies significantly below the stress sensitivities of the conventional MEMS structures.

Figure 10:
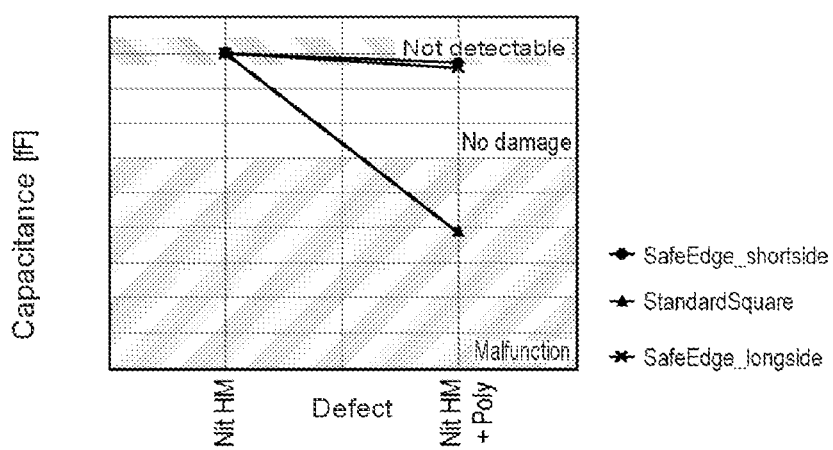
FIG. 10 shows a diagram illustrating shifts in the capacitance of MEMS devices with different movable MEMS structures which can arise as a result of a defect in the movable MEMS structure.

FIG. 10 shows a diagram illustrating the shifts in capacitance of MEMS devices with different movable MEMS structures. The shifts in capacitance can arise as a result of a defect in the respective movable MEMS structure. In the diagram in FIG. 10, a shift in capacitance (in fF) is plotted against the magnitude of a defect in the respective MEMS structure. The illustrated data is simulation data.

The shifts in capacitance are shown for a conventional square MEMS structure (cf. "StandardSquare"), a rectangular MEMS structure with an additional second support structure, wherein a defect is arranged on the short side of the rectangle (cf. "SafeEdge_shortside") and a rectangular MEMS structure with an additional second support structure, wherein a defect is arranged on the long side of the rectangle (cf. "SafeEdge_longside"). The curves which are shown have essentially linear profiles and show that the shift in capacitance of the respective MEMS structure increases with the magnitude of the defect. From FIG. 10 it is clear that the shifts in capacitance for the MEMS structures with an additional second support structure are significantly smaller than the shift in capacitance of the conventional MEMS structure. The shifts in capacitance for the MEMS structures with an additional second support structure can even lie in a range which does not necessarily have to be detectable. In contrast to this, the shift in capacitance of the conventional MEMS structure in the case of a sufficiently large defect can even bring about a malfunction.

EXAMPLES

In the text which follows, MEMS devices and methods for producing MEMS devices will be explained by means of examples.

Example 1 is a MEMS device comprising: a movable MEMS structure; a first support structure in which an edge of the MEMS structure is attached; a cavity which is bounded by the MEMS structure and the first support structure; and a second support structure which is attached in the cavity and at the edge of the MEMS structure and is configured so as to support the edge of the MEMS structure mechanically.

Example 2 is a MEMS device according to Example 1, wherein: the MEMS structure has a first surface area, the second support structure encloses a partial area of the MEMS structure with a second surface area, and a ratio of the second surface area to the first surface area is greater than 0.5.

Example 3 is a MEMS device according to Example 1 or 2, wherein a ratio of a distance between the second support structure and the edge of the MEMS structure to a distance between opposite sections of the second support structure is smaller than 0.2.

Example 4 is a MEMS device according to one of the preceding examples, wherein a distance between the second support structure and the edge of the MEMS structure is configured in such a way that the MEMS structure is configured so as to sense pressure signals.

Example 5 is a MEMS device according to one of the preceding examples, wherein the second support structure is spaced apart from the first support structure and runs essentially parallel to the edge of the MEMS structure.

Example 6 is a MEMS device according to one of the preceding examples, wherein the second support structure comprises a first multiplicity of columns which are arranged in a first row along the edge of the MEMS structure.

Example 7 is a MEMS device according to Example 6, wherein a maximum distance between adjacent columns is smaller than 40 micrometers.

Example 8 is a MEMS device according to Example 6 or 7, wherein the second support structure comprises a second multiplicity of columns which are arranged in a second row along the first row.

Example 9 is a MEMS device according to one of the preceding examples, wherein the second support structure comprises a wall structure which forms a closed curve in a plan view of the MEMS structure.

Example 10 is a MEMS device according to Example 9, wherein the closed curve has a multiplicity of interruptions.

Example 11 is a MEMS device according to one of the preceding examples, wherein the second support structure runs along the entire edge of the MEMS structure.

Example 12 is a MEMS device according to one of the preceding examples, wherein the edge of the MEMS structure has a multiplicity of notches.

Example 13 is a MEMS device according to one of the preceding examples, wherein the second support structure extends continuously from a bottom face of the cavity as far as an underside of the MEMS structure.

Example 14 is a MEMS device according to one of the preceding examples, wherein the second support structure is fabricated from at least one of the following: polycrystalline silicon, monocrystalline silicon, an oxide, a metal, a metal alloy.

Example 15 is a MEMS device according to one of the preceding examples, wherein the MEMS structure has depressions on a surface of the MEMS structure facing away from the cavity, at locations on the second support structure lying underneath.

Example 16 is a MEMS device according to one of the preceding examples, wherein: the MEMS structure comprises a membrane, and the MEMS device comprises a capacitive pressure sensor or a microphone.

Example 17 is a method for producing a MEMS device, wherein the method comprises: depositing a sacrificial layer; forming at least one opening in the sacrificial layer; depositing a first material in the at least one opening in the sacrificial layer; depositing a second material over the sacrificial layer, wherein: a first support structure and a MEMS structure are formed, an edge of the MEMS structure is attached in the first support structure, and the material which is deposited in the at least one opening forms a second support structure which is attached at the edge of the MEMS structure and is configured so as to support the edge of the MEMS structure mechanically; and removing the sacrificial layer, wherein a cavity which is bounded by the MEMS structure and the first support structure is formed.

Example 18 is a method according to Example 17, wherein the first material and the second material are identical and are deposited simultaneously by means of an identical process step.

Example 19 is a method according to Example 17 or 18, wherein the formation of at least one opening in the sacrificial layer comprises: forming a multiplicity of openings in the sacrificial layer, wherein a material which is deposited in the multiplicity of openings comprises, after the removal of the sacrificial layer, a multiplicity of columns which are arranged in a row along the edge of the MEMS structure.

Example 20 is a method according to one of Examples 17 to 19, wherein the formation of the at least one opening in the sacrificial layer comprises: forming a trench in the sacrificial layer, wherein a material which is deposited in the trench comprises, after removal of the sacrificial layer, a wall structure which forms a closed curve in a plan view of the MEMS structure.

Although specific embodiments are illustrated and described herein, it is obvious to a person skilled in the art that a multiplicity of alternative and/or equivalent implementations can replace the specific embodiments which are shown and described, without departing from the scope of the present disclosure. This application is intended to cover all the adaptations or variations of the specific embodiments discussed here. It is therefore intended that this disclosure is limited only by the claims and their equivalents.

What is claimed is:

1. A microelectromechanical system (MEMS) device comprising:
   a movable MEMS structure;
   a first support structure attached to an edge of the movable MEMS structure;
   a cavity bounded by the movable MEMS structure and the first support structure; and
   a second support structure attached in the cavity to the movable MEMS structure and is configured to support the edge of the movable MEMS structure mechanically.

2. The MEMS device of claim 1, wherein:
   the movable MEMS structure has a first surface area,
   the second support structure encloses a partial area of the movable MEMS structure with a second surface area, and
   a ratio of the second surface area to the first surface area is greater than 0.5.

3. The MEMS device of claim 1, wherein a ratio of a distance between the second support structure and the edge of the movable MEMS structure to a distance between opposite sections of the second support structure is smaller than 0.2.

4. The MEMS device of claim 1, wherein a distance between the second support structure and the edge of the movable MEMS structure is configured in such a way that the movable MEMS structure is configured so as to sense pressure signals.

5. The MEMS device of claim 1, wherein the second support structure is spaced apart from the first support structure and runs substantially parallel to the edge of the movable MEMS structure.

6. The MEMS device of claim 1, wherein the second support structure comprises a first multiplicity of columns that are arranged in a first row along the edge of the movable MEMS structure.

7. The MEMS device of claim 6, wherein a maximum distance between adjacent columns is smaller than 40 micrometers.

8. The MEMS device of claim 6, wherein the second support structure comprises a second multiplicity of columns that are arranged in a second row along the first row.

9. The MEMS device of claim 1, wherein the second support structure comprises a wall structure that forms a closed curve in a plan view of the movable MEMS structure.

10. The MEMS device of claim 9, wherein the closed curve has a plurality of interruptions such that the wall structure includes a plurality of wall segments.

11. The MEMS device of claim 1, wherein the second support structure runs along an entire edge of the movable MEMS structure.

12. The MEMS device of claim 1, wherein the edge of the movable MEMS structure has a plurality of notches.

13. The MEMS device of claim 1, wherein the second support structure extends continuously from a bottom face of the cavity as far as an underside of the movable MEMS structure.

14. The MEMS device of claim 1, wherein the second support structure is made of at least one of: polycrystalline silicon, monocrystalline silicon, an oxide, a metal, or a metal alloy.

15. The MEMS device of claim 1, wherein the movable MEMS structure has depressions on a surface of the movable MEMS structure facing away from the cavity, wherein the depressions are formed at locations on the second support structure which underlies the surface of the movable MEMS structure.

16. The MEMS device as claimed in claim 1, wherein:
the movable MEMS structure comprises a membrane, and
the MEMS device is a capacitive pressure sensor or a microphone.

17. A method for producing a MEMS device, wherein the method comprises:
depositing a sacrificial layer;
forming at least one opening in the sacrificial layer;
depositing a first material in the at least one opening;
depositing a second material over the sacrificial layer, wherein:
a first support structure and a movable MEMS structure are formed,
an edge of the movable MEMS structure is attached to the first support structure, and
the first material, deposited in the at least one opening, forms a second support structure attached to the movable MEMS structure and is configured to support the edge of the movable MEMS structure mechanically; and removing the sacrificial layer,
wherein a cavity bounded by the movable MEMS structure and the first support structure is formed, and
wherein the second support structure is attached in the cavity to the movable MEMS structure based on the sacrificial layer being removed.

18. The method of claim 17, wherein the first material and the second material are identical and are deposited simultaneously.

19. The method of claim 17, wherein forming the at least one opening in the sacrificial layer comprises:
forming a plurality of openings in the sacrificial layer, wherein the first material deposited in the plurality of openings forms, after the sacrificial layer is removed, a plurality of columns arranged in a row along the edge of the movable MEMS structure.

20. The method of claim 17, wherein forming the at least one opening in the sacrificial layer comprises:
forming a trench in the sacrificial layer, wherein the first material deposited in the trench forms, after the sacrificial layer is removed, a wall structure comprising a closed curve in a plan view of the movable MEMS structure.

* * * * *